United States Patent [19]
Tu et al.

[11] Patent Number: 5,869,399
[45] Date of Patent: Feb. 9, 1999

[54] METHOD FOR INCREASING UTILIZABLE SURFACE OF RUGGED POLYSILICON LAYER IN SEMICONDUCTOR DEVICE

[75] Inventors: Tuby Tu; Kuang-Chao Chen, both of Hsinchu, Taiwan

[73] Assignee: Mosel Vitelic Inc., Hsinchu, Taiwan

[21] Appl. No.: 908,319

[22] Filed: Aug. 7, 1997

[51] Int. Cl.$^6$ ...................................................... H01L 21/00
[52] U.S. Cl. .......................... 438/705; 438/704; 438/719; 438/733; 438/753; 216/62; 216/87
[58] Field of Search .................................... 438/704, 705, 438/713, 719, 733, 735, 738, 745, 753; 252/79.3, 79.2; 216/62, 87

[56] References Cited

U.S. PATENT DOCUMENTS

| | | | |
|---|---|---|---|
| 3,980,507 | 9/1976 | Carley | 438/705 X |
| 4,648,939 | 3/1987 | Maa et al. | 438/713 X |
| 5,149,676 | 9/1992 | Kim et al. | 438/704 X |
| 5,639,689 | 6/1997 | Woo | 438/705 X |

*Primary Examiner*—William Powell
*Attorney, Agent, or Firm*—Lackenbach Siegel Marzullo Aronson & Greenspan, P.C.

[57] ABSTRACT

The present invention is related to a method for increasing utilzable surface area of a rugged polysilicon layer in a semiconductor device. The present method includes steps of: (a) providing a pre-grown rugged polysilicon layer which is composed of polysilicon with first dopants doped therein; (b) forming another polyslicon layer on the pre-grown rugged polysilicon layer; (c) removing a portion of the another polysilicon layer by an anisotropic etching process to expose an upper surface of the pre-grown rugged polysilicon layer; and (d) etching the resulting pre-grown rugged polysilicon layer which an etching selectivity ratio of the pre-grown rugged polysilicon layer to the another polysilicon layer being greater than one, to obtain the rugged polysilicon layer having increasing utilizable surface area. A semiconductor device containing the rugged polysilicon layer created according to the present invention can work well in a relatively dense and small semiconductor chip.

10 Claims, 1 Drawing Sheet

METHOD FOR INCREASING UTILIZABLE SURFACE OF RUGGED POLYSILICON LAYER IN SEMICONDUCTOR DEVICE

FIELD OF THE INVENTION

The present invention is related to a method for increasing utilizable surface area of a rugged polysilicon layer in a semiconductor device.

BACKGROUND OF TEE INVENTION

In a semiconductor manufacturing process, creating a rugged polysilicon layer is a popular way to increase the utilizable surface area of electrode plates of a capacitor so as to increase the charge capacity of the capacitor. It is especially often used for manufacturing storage capacitors of a dynamic random access memory (DRAM). However, when the element arrangement in a semiconductor chip is getting denser or the size of the semiconductor chip is getting smaller as is the current trend, the utilizable surface area provided by the conventional rugged polysilicon layer (refer to the structure shown FIG. 1A) will become insufficient.

SUMMARY OF THE INVENTION

Therefore, the object of the present invention is to provide a method for increasing utilizable surface area of a rugged polysilicon layer in a semiconductor device, which includes steps of: (a) providing a pre-grown rugged polysilicon layer which is composed of polysilicon with first dopants doped therein; (b) forming another polysilicon layer on the pre-grown rugged polysilicon layer; (c) removing a portion of the another polysilicon layer by an anisotropic etching process to expose an upper surface of the pre-grown rugged polysilicon layer; and (d) etching the resulting pre-grown rugged polysilicon layer with an etching selectivity ratio of the pre-grown rugged polysilicon layer to the another polysilicon layer being greater than one, to obtain the rugged polysilicon layer having increasing utilizable surface area.

Preferably, the first dopoants are phosphorus impurities.

In a preferred embodiment, the another polysilicon layer is doped with second dopants such as arsenic impurities. In another preferred embodiment, the another polysilicon layer has no dopants therein. When the another polysilicon layer has no dopants therein, the first dopoants can be arsenic impurities as well as phosphorus impurities.

In accordance with another aspect of the invention, the step (d) is performed by using a solution including hydrofluoride, nitric acid and water as an etchant.

In accordance with another aspect of the invention, the anisotropic etching process used in the step (c) is a dry etching process.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Preferred embodiments according to the present invention are given hereinafter to illustrate how the utilizable surface area of a rugged polysilicon layer in a semiconductor device increases by creating a new configuration of rugged polysilicon layer.

Figure 1A:
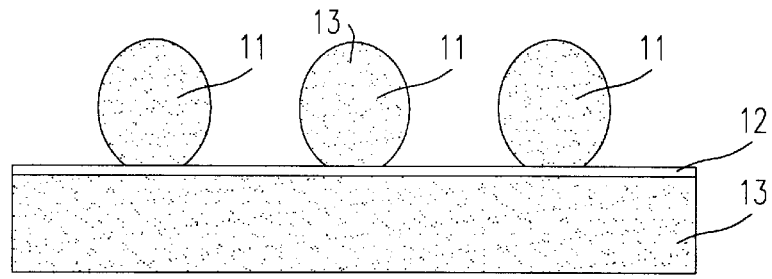
FIGS. 1A~1D schematically show the steps for creating a new configuration of rugged polysilicon layer in a semiconductor device according to a preferred embodiment of the present invention, in which the utilizable surface area of the rugged polysilicon layer is increased.
Figure 1B:
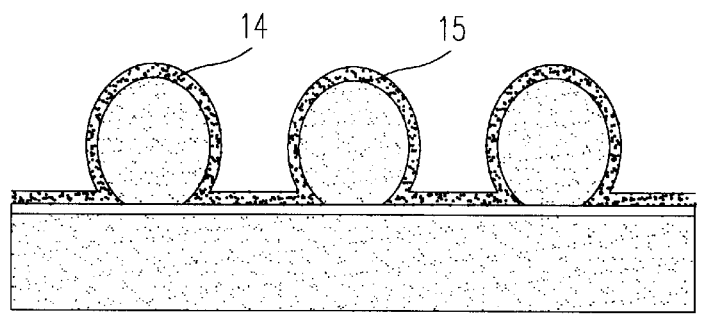
Figure 1C:
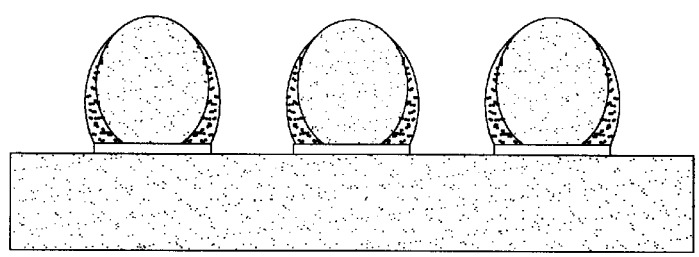
Figure 1D:
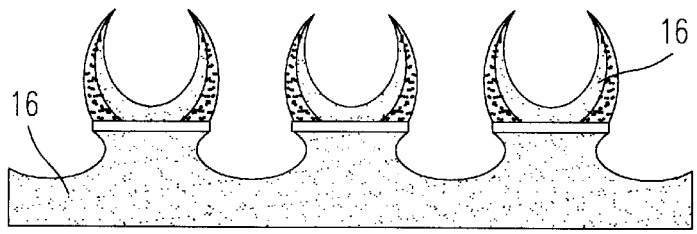

Please refer to FIGS. 1A~1D. FIG. 1A shows a conventional rugged polysilicon layer 11 having phosphorus impurities 13 doped therein with a thin oxide layer 12 distributed therein. The growing process of the conventional rugged polysilicon layer and the dope of the phosphorus impurities are well know to those skilled in the art, so they are not to be redundantly described here, and as known to those skilled in the art, the thin oxide layer 12 is formed during the growth of the rugged polysilicon layer 11. After the phosphorus-doped rugged polysilicon layer 11 is provided, another polysilicon layer 14 is formed on the phosphorus-doped rugged polysilicon layer 11 by any appropriate method, and doped with arsenic impurities 15, as shown in FIG. 1B. Then, the polysilicon layer 14 with arsenic impurities doped therein is anisotropically etched by a dry etching process to remove a portion of the polysilicon layer 14 so as to expose the top surface of the polysilicon layer 11, as shown in FIG. 1C. After the anisotropic etching step, an S-acid solution composed of hydrofluoride, nitric acid and water is used as an etchant to etch the polysilicon layers 11 and 14. As known to those skilled in the art, when the S-acid solution is used as the etchant, the etching selectivity ratio of the rugged polysilicon layer 11 having therein phosphorus dopants to the polysilicon layer 14 having therein arsenic dopants is greater than one. In other words, the polysilicon layer 11 is etched more quickly than the polysilicon layer 14 so as to obtain a new configuration of rugged polysilicon layer 16 as shown in FIG. 1D. It is apparent that the new configuration of rugged polysilicon layer has increasing utilizable surface area.

In another preferred embodiment, a polysilicon layer having no dopants therein can be used to replace for the polysilicon layer 14. The S-acid solution is also proper for serving as the etchant of the two polysilicon layers because the etching selectivity ratio of the rugged polysilicon layer having therein phosphorus dopants to the polysilicon layer having therein no dopants is also greater than one when the S-acid solution is used.

In a further preferred embodiment, a polysilicon layer having no dopants therein is used to replace for the polysilicon layer 14 and a rugged polysilicon layer with arsenic dopants therein is used to replace for the polysilicon layer 11 with phosphorus dopants therein. In this case, the S-acid-solution can also be used as the etchant.

Of course, any other etchant can be used for selectively etching the polysilicon layers as long as it has an etching selectivity ratio of the rugged polysilicon layer 11 to the polysilicon layer 14 greater than one.

From the above preferred embodiments, it can be seen that the utilizable surface area can be increased by creating a new configuration of rugged polysilicon layer as shown in FIG. 1D. Therefore, a semiconductor device containing the present rugged polysilicon layer can work well in a even denser semiconductor chip.

While the invention has been described in terms of what are presently considered to be the most practical and preferred embodiments, it is to be understood that the invention need not be limited to the disclosed embodiment. On the contrary, it is intended to covet various modifications and similar arrangements included within the spirit and scope of the appended claims which are to be accorded with the broadest interpretation so as to encompass all such modifications and similar structures.

What is claimed is:

1. A method for increasing utilizable surface area of a rugged polysilicon layer in a semiconductor device, comprising steps of:

(a) providing a pre-grown rugged polysilicon layer which is composed of polysilicon with first dopants doped therein;

(b) forming another polysilicon layer on said pre-grown rugged polysilicon layer;

(c) removing a portion of said another polysilicon layer by an anisotropic etching process to expose an upper surface of said pre-grown rugged polysilicon layer, and (d) etching the resulting pre-grown rugged polysilicon layer with an etching selectivity ratio of said pre-grown rugged polysilicon layer to said another polysilicon layer being greater than one, to obtain said rugged polysilicon layer having increasing utilizable surface area.

2. The method according to claim 1 wherein said another polysilicon layer is doped therein with second dopants.

3. The method according to claim 2 wherein said first dopoants are phosphorus impurities.

4. The method according to claim 3 wherein said second dopoants are arsenic impurities.

5. The method according to claim 4 wherein said step (d) is performed by using a solution including hydrofluoride, nitric acid and water as an etchant.

6. The method according to claim 1 wherein said first doppants are phosphorus impurities.

7. The method according to claim 6 wherein said step (d) is performed by using a solution including hydrofluoride, nitric acid and water as an etchant.

8. The method according to claim 1 wherein said first dopoants are arsenic impurities.

9. The method according to claim 8 wherein said step (d) is performed by using a solution including hydrofluoride, nitric acid and water as an etchant.

10. The method according to claim 1 wherein said anisotropic etching process used in said step (c) is a dry etching process.

* * * * *